(12) United States Patent
del Cesta

(10) Patent No.: US 11,831,314 B1
(45) Date of Patent: Nov. 28, 2023

(54) RATIOMETRIC CURRENT OR VOLTAGE SOURCE CIRCUIT WITH REDUCED TEMPERATURE DEPENDENCE

(71) Applicant: Apple Inc., Cupertino, CA (US)

(72) Inventor: Simone del Cesta, Pisa (IT)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/823,655

(22) Filed: Aug. 31, 2022

(51) Int. Cl.
| | | |
|---|---|---|
| *H03L 1/02* | (2006.01) | |
| *G05F 3/24* | (2006.01) | |
| *H03K 3/011* | (2006.01) | |
| *H03K 3/023* | (2006.01) | |
| *H03K 3/03* | (2006.01) | |

(52) U.S. Cl.
CPC ............. *H03K 3/011* (2013.01); *G05F 3/245* (2013.01); *H03K 3/023* (2013.01); *H03K 3/0315* (2013.01); *H03L 1/022* (2013.01)

(58) Field of Classification Search
CPC .......... G05F 3/225; G05F 3/227; G05F 3/245; G05F 3/247; H03K 3/011; H03L 1/00; H03L 1/02; H03L 1/022–027
See application file for complete search history.

(56) References Cited

U.S. PATENT DOCUMENTS

| | | | | |
|---|---|---|---|---|
| 3,831,003 A | * | 8/1974 | Foerster .................. | G05D 23/24 219/501 |
| 4,316,155 A | * | 2/1982 | Hanisko .................... | H03L 1/00 331/82 |
| 4,352,053 A | * | 9/1982 | Oguchi .................... | H03L 1/023 330/289 |
| 4,511,863 A | * | 4/1985 | Vandegraaf ............. | H03L 1/023 332/119 |
| 5,548,464 A | * | 8/1996 | Manning .................. | H02H 7/09 361/25 |
| 5,795,069 A | * | 8/1998 | Mattes ..................... | G01K 7/25 374/E7.027 |
| 2002/0180544 A1 | * | 12/2002 | Fukayama ............... | H03B 5/32 331/176 |

(Continued)

OTHER PUBLICATIONS

P. Bruschi et al., "A Two-Stage Switched Capacitor Integrator for High Gain Inverter-Like Architectures," IEEE Transactions on Circuits and Systems—II: Express Briefs, vol. 67, No. 2, Feb. 2020, 5 pages.

*Primary Examiner* — Levi Gannon
(74) *Attorney, Agent, or Firm* — Kowert, Hood, Munyon, Rankin & Goetzel, P.C.; Gentry C. McLean; Dean M. Munyon

(57) ABSTRACT

A ratiometric current source circuit having a reduced temperature dependence is disclosed. An embodiment of the current source circuit includes a first divider circuit configured to generate a reference voltage using a voltage level of a power supply node and a second divider circuit including a first resistor with a first temperature coefficient and a second resistor with a second temperature coefficient. The first resistor is configured to generate a first current using an input voltage and the voltage level of the power supply node and the second resistor is configured to generate a second current using the input voltage. The embodiment further includes a buffer circuit configured to generate the input voltage using the reference voltage and generate an output current using a difference between the first current and the second current.

20 Claims, 11 Drawing Sheets

(56) References Cited

U.S. PATENT DOCUMENTS

| | | | |
|---|---|---|---|
| 2004/0244478 A1* | 12/2004 | Kanke | G01F 1/72 |
| | | | 73/204.15 |
| 2007/0273453 A1 | 11/2007 | Maher | |
| 2009/0051443 A1 | 2/2009 | Illegems et al. | |
| 2012/0036389 A1* | 2/2012 | Prihadi | H03L 1/022 |
| | | | 713/500 |
| 2012/0319793 A1 | 12/2012 | Iwasa | |
| 2016/0322981 A1* | 11/2016 | Ramanan | H03K 3/027 |
| 2021/0041509 A1* | 2/2021 | Jiang | G01R 33/0041 |

* cited by examiner

US 11,831,314 B1

RATIOMETRIC CURRENT OR VOLTAGE SOURCE CIRCUIT WITH REDUCED TEMPERATURE DEPENDENCE

BACKGROUND

Technical Field

Embodiments described herein relate to integrated circuits, and more particularly, to techniques for generating a current source having a reduced dependence on temperature.

Description of the Related Art

Modern computer systems may include multiple circuit blocks designed to perform various functions. For example, such circuit blocks may include processors and/or processor cores configured to execute software or program instructions. Additionally, the circuit blocks may include memory circuits, mixed-signal or analog circuits, and the like.

Circuit blocks and the various circuits within them often employ current source circuits. An ideal current source circuit is a circuit that provides a constant current to a load regardless of the voltage drop across the load. Such an ideal current source circuit can be modeled as having an infinite internal resistance. A physical current source circuit is not ideal, instead having a finite internal resistance and a maximum voltage that can be supplied to a load.

A current source circuit configured to deliver a constant current not dependent on another quantity in the circuit may be called an "independent" current source circuit. A current source circuit configured to deliver a current dependent on a voltage or current elsewhere in the circuit may be called a "dependent" or "controlled" current source circuit. A dependent current source circuit providing a current directly proportional to its supply voltage may also be called a "ratiometric" current source circuit. Whether or not considered a "dependent" current source circuit, a current source circuit may generate an output current that is dependent on quantities, such as temperature, other than currents or voltages in the circuit.

Circuit blocks within a computer system also use clock signals to control timing of their operations. These clock signals are often generated using voltage-controlled oscillator (VCO) circuits. A VCO circuit is designed to allow the frequency of an oscillator to be controlled using a control voltage. The control voltage for a VCO circuit, and therefore the frequency of the clock signal produced, can be affected by quantities such as temperature and supply voltage.

BRIEF DESCRIPTION OF THE DRAWINGS

The following detailed description makes reference to the accompanying drawings, which are now briefly described.

DETAILED DESCRIPTION OF EMBODIMENTS

Figure 1:
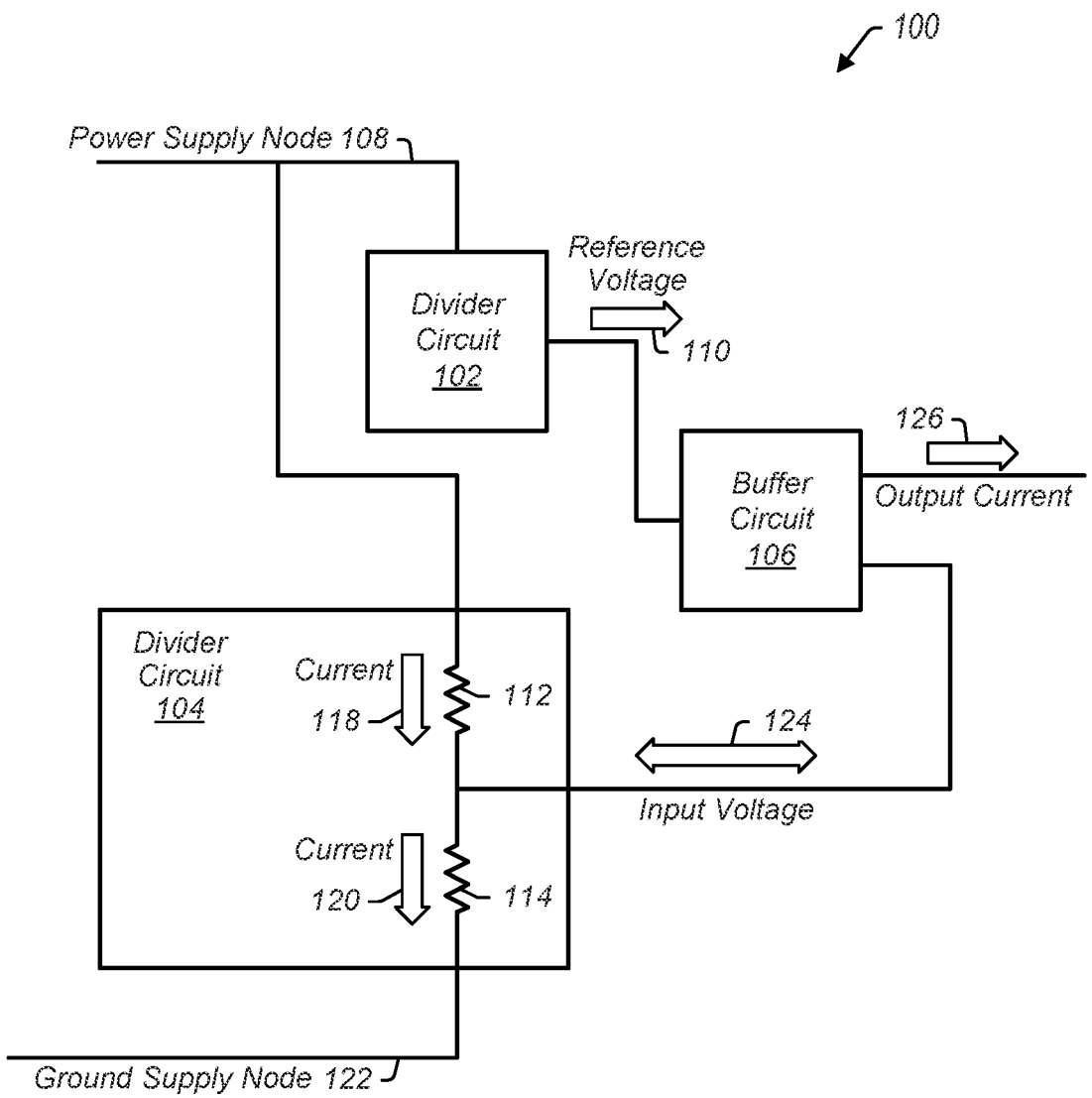
FIG. 1 is a block diagram of an embodiment of a current or voltage source circuit.

Computer systems may include multiple circuit blocks configured to perform specific functions. For example, a computer system may include a processor circuit, a memory circuit, and various analog, radio-frequency, and mixed-signal circuits. Such analog, radio-frequency, and mixed-signal circuits may perform a variety of functions, such as analog-to-digital conversion, radio-frequency up convert and down convert, amplification of signals, and the like.

Operation of a circuit involves heat generation, primarily through resistive heating by flow of electrical current through resistances within the circuit. This heat generation can raise the temperature of operation of a circuit, and changes in the current density within a circuit can cause the operating temperature to rise and fall over time. The high density of circuits formed within an integrated circuit (IC) chip can make ICs particularly susceptible to thermal effects, and mobile computer systems packing multiple ICs into a small package can experience significant thermal effects as well. Certain types of circuits can generate more heat than others. For example, power management circuits that generate power supply voltage levels needed by various functional circuits may operate at high current densities and generate a relatively large amount of heat. As another example, significant amounts of heat may also be generated by voltage regulator circuits that dissipate power from excess input voltage in order to generate a fixed output voltage level.

Changes in temperature, whether from heat generation or other causes such as operating environment, can cause errors in circuit operation. Because an amount of current flowing through a semiconductor device changes with temperature, current or voltage source circuits can produce reference currents or voltages that vary with temperature. This can lead to changes in bias point of analog circuits, for example, which can cause signal distortion. For analog-to-digital (A/D) conversion circuits, as another example, shifting of voltage levels due to temperature variation could cause incorrect digital data values to be assigned. In still another example, VCO circuits used to generate clock signals used throughout a computer system have oscillation frequencies dependent upon a control voltage value. Shifting of clock signal frequencies caused by temperature variation of control voltage levels can cause timing requirements of logic gates using the clock signals to be violated. This can cause data errors due to, for example, setup or hold time errors in which the proper data is not available to a gate at the time it is needed.

Circuit operation errors similar to those described above in connection with temperature variations can also be caused by supply voltage variation in a circuit. In some cases supply voltage variation is itself caused by temperature effects on power provided by a battery or by a power management circuit. Supply voltage variations such as drift or glitches may also be caused by factors such as changes over time of component values in power management circuits or dynamic changes in power usage and loading within a computer system.

Existing ways that temperature and supply voltage dependencies are addressed may be impractical or undesirably expensive to implement. For example, many circuits for countering temperature variation of resistor values involve establishing one current proportional to temperature (increasing as temperature increases, for example) and another current complementary to temperature (decreasing as temperature increases) and then combining those currents such that components of these currents (or voltages associated with them) resulting from temperature variation cancel one another to generate a current or voltage relatively independent of temperature. A simple example of this concept is making a resistor string including one resistor having a positive temperature coefficient (characterizing a resistance that rises as temperature rises) and another resistor having a negative temperature coefficient (characterizing a resistance that falls as temperature rises) in such a way that variations of the two resistances offset one another and the combined string resistance is relatively stable with temperature. In practical semiconductor fabrication processes used for fabricating integrated circuits, however, it is difficult to produce resistors having both positive and negative temperature coefficients.

A more complex example of using proportional and complementary currents to counter temperature variation is a bandgap reference circuit. In an embodiment, a bandgap reference circuit uses a voltage difference between two p-n junctions to generate a proportional current and a voltage across one p-n junction to generate a complementary current. This circuit produces a voltage, close to the bandgap of the semiconductor material used, which is relatively independent of both temperature and supply voltage. Bandgap reference circuits typically employ bipolar transistor technology, however, which consumes a relatively large area in an IC and introduces design complexity to circuits using primarily metal-oxide-semiconductor (MOS) technology. In general, the effects of supply voltage variation can be reduced by requiring supply voltages for sensitive circuits (such as VCO circuits) to be extremely well regulated. In some cases, additional voltage regulation circuitry may be included in the sensitive circuit itself. A high degree of voltage regulation may consume an undesirable amount of circuit area and may undesirably increase power dissipation in a circuit, however.

Techniques described in the present disclosure allow for the generation of a current that is proportional to supply voltage while having a reduced dependence on temperature. A current source circuit as disclosed herein can be used in generating a clock signal having a frequency less affected by variations in supply voltage. An embodiment of an oscillator sub-system architecture used in generating the clock signal may include a frequency control circuit configured to use an error signal produced by comparing a frequency threshold signal that is proportional to the supply voltage to a signal reflecting the frequency of a time-varying signal generated using the current source. This error signal may be relatively temperature-independent and have an attenuated dependence on the supply voltage. The error signal may then be used to generate a frequency control signal for a VCO.

A block diagram depicting an embodiment of a current or voltage source circuit is depicted in FIG. 1. As illustrated, circuit 100 includes a first divider circuit 102, a second divider circuit 104, and a buffer circuit 106. As described below, circuit 100 may operate as either a current or voltage source depending on the configuration of buffer circuit 106.

Divider circuit 102 is configured to generate, using a voltage level of input power supply node 108, reference voltage 110. In various embodiments, divider circuit 102 may by implemented as a resistive voltage divider circuit, as described further in connection with FIG. 4 herein. Arrows used herein to represent voltages or currents are intended to aid in explanation of circuit operation and do not necessarily indicate a direction of a physical flow.

Divider circuit 104 includes a first resistor 112 and a second resistor 114. Input node 116 between resistors 112 and 114 is at input voltage 124. Each of resistors 112 and 114 has a temperature coefficient of resistance, or "temperature coefficient," describing how its resistance changes with change in temperature about a fixed temperature. A fixed temperature of 20° C., which may be referred to as "room temperature," is often used in defining resistance values and temperature coefficients for resistors. In an embodiment, the temperature coefficients of resistors 112 and 114 have the same sign (both coefficients are negative or both are positive).

Resistors 112 and 114 are in some embodiments formed from polysilicon as part of a semiconductor manufacturing process, or from any other suitable material available in such a process. In a further embodiment, one of resistors 112 and 114 is formed from a higher-resistivity polysilicon and one from a lower-resistivity polysilicon. Such an embodiment may allow a suitable compromise between limiting current consumption of current source circuit 100 (with the higher-resistivity material) and limiting "spread" of resistance values caused by process variations (with the lower-resistivity material). Arrangement of resistors 112 and 114 between power supply node 108 and ground supply node 122, with input voltage 124 on input node 116, causes current 118 to flow through resistor 112 and current 120 to flow through resistor 114.

Buffer circuit 106 is configured to generate input voltage 124 using reference voltage 110 and to generate output current 126 using a difference between current 118 and 120. In an embodiment, buffer circuit 106 may be implemented using a differential amplifier connected in a feedback arrangement. Examples of buffer circuit embodiments are described further in connection with FIG. 2 and FIG. 3 herein. As described further in connection with FIG. 2, the dependence of output current 126 on the difference between currents 118 and 120 allows values of resistors 112 and 114 to be chosen such that output current 126 is constant, to first order, about a specified temperature value. Output current 126 is ratiometric, or proportional, to the supply voltage, which is the difference between the voltage levels of power supply node 108 and ground supply node 122. The reduced temperature dependence and ratiometric property of circuit 100 may allow its use in an oscillator sub-system generating a clock signal with a frequency having a reduced dependence on both temperature and supply voltage.

Figure 2:
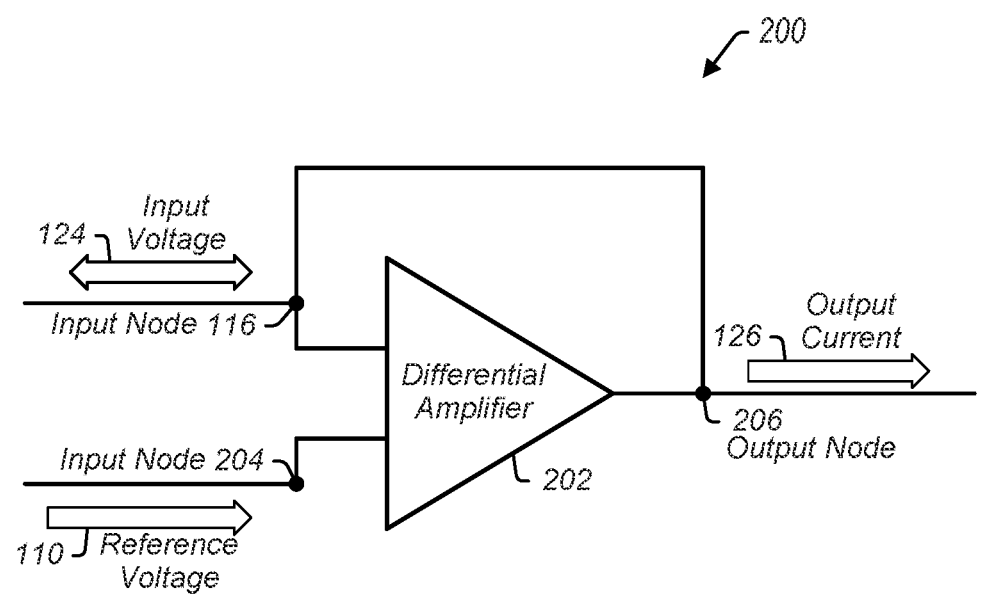
FIG. 2 is a block diagram of an embodiment of a buffer circuit.

Turning to FIG. 2, a block diagram of an embodiment of a buffer circuit is depicted. Buffer circuit 200 can implement one embodiment of buffer circuit 106 of FIG. 1. As illustrated, buffer circuit 200 includes a differential amplifier 202 connected in a buffer configuration with an inverting input node 116 coupled to output node 206. Input voltage 124 produced by divider circuit 104 is coupled to input node 116, while reference voltage 110 produced by divider circuit 102 is coupled to a noninverting input node 204.

In some embodiments, differential amplifier 202 is implemented as an operational amplifier or other suitable amplifier circuit configured to generate an output having a value proportional to a difference between two input values. Differential amplifier 202 and other amplifiers described herein may in various embodiments employ bipolar devices, MOS devices, or any suitable combination of these. MOS devices may include, for example, various types of MOS field-effect transistors (MOSFETs), including multiple-gate or three-dimensional MOSFETs such as FinFETs or gate-all-around FETs (GAAFETs).

In an embodiment, differential amplifier 202 has characteristics similar to an ideal operational amplifier—i.e., high differential-mode gain, high input impedance and low output impedance. In such an embodiment, differential amplifier 202 is configured to cause the output voltage, in this case the same as input voltage 124, to be approximately equal to reference voltage 110. Divider circuit 102 can therefore be used to set the level of input voltage 124, by setting reference voltage 110. In an embodiment, input voltage 124 is set to approximately one-half of the supply voltage.

In an embodiment, differential amplifier 202 is configured to cause output current 126 to be approximately equal to the current flowing from divider circuit 104 to input node 116. Output current 126 can therefore be expressed as the difference between currents 118 and 120 in divider circuit 104. Using Ohm's law, the output current can then be expressed in terms of the supply voltage $V_{supply}$, and resistance values. For an embodiment with input voltage 124 set to $V_{supply}/2$ the output current 126 at a fixed temperature can be expressed using Equation 1 where $I_{126}$ is current 126 and $R_{112F}$ and $R_{114F}$ are resistance values in ohms of resistors 112 and 114 at the fixed temperature ($R_{112F}$ and $R_{114F}$ may also be referred to as nominal values of resistors 112 and 114).

$$I_{126} \approx \frac{V_{supply}}{2R_{112F}} - \frac{V_{supply}}{2R_{114F}} \qquad (1)$$

The temperature dependence of resistor 112 can be expressed using Equation 2, where $\alpha_{112}$ is the temperature coefficient of resistor 112 in ppm/K and $\Delta T$ is the temperature change in Kelvin from the fixed (or nominal) temperature.

$$R_{112}(T) = R_{112F}(1 + \alpha_{112} \cdot \Delta T) \qquad (2)$$

The temperature dependence of resistor 114 can similarly be expressed using Equation 3, where $\alpha_{114}$ is the temperature coefficient of resistor 114 in ppm/K.

$$R_{114}(T) = R_{114F}(1 + \alpha_{114} \cdot \Delta T) \qquad (3)$$

These temperature-dependent resistance expressions can be used to express the output current as a function of temperature. It can be shown that a derivative of the output current with respect to temperature goes to zero at the nominal temperature when the ratio of $R_{112F}$ and $R_{114F}$ is a particular function of $\alpha_{112}$ and $\alpha_{114}$ when $\alpha_{112}$ and $\alpha_{114}$ have the same sign, as shown in Equation 4.

$$\frac{R_{112F}}{R_{114F}} = \frac{\alpha_{112}}{\alpha_{114}} \qquad (4)$$

Resistance values and temperature coefficients can therefore be chosen such that the output current 126 of buffer circuit 200 is independent of temperature, at least for some degree of variation in temperature about the fixed temperature. Because divider circuit 104 in conjunction with buffer circuit 200 establishes an output current dependent on a subtraction of the currents through resistors 112 and 114, the temperature dependence of the output current can be set to zero even when the temperature coefficients of the two resistors have the same sign. Circuit 100 using buffer circuit 200 may, therefore, implement a current source circuit having a reduced dependence on temperature in a much simpler way than other circuits such as bandgap reference circuits. Output current 126 is proportional to, or ratiometric with, supply voltage. This ratiometric property may help to reduce the influence of supply voltage variation in implementations involving comparison to another quantity that is also ratiometric with supply voltage.

In some embodiments, resistors 112 and 114 are formed as part of a semiconductor fabrication process and values of these resistors are adjusted during a testing and repair phase of the process. For example, laser trimming, in which a laser is used to selectively remove portions of the material forming an integrated circuit element, is an example of a method for adjusting resistance values. If testing of a fabricated circuit shows that the ratio of resistance values for resistors 112 and 114 is not the intended function of the temperature coefficients of the resistors, adjustment of one or both of the resistor values may be performed in some embodiments before final packaging of an integrated circuit containing current source circuit 100.

Figure 3:
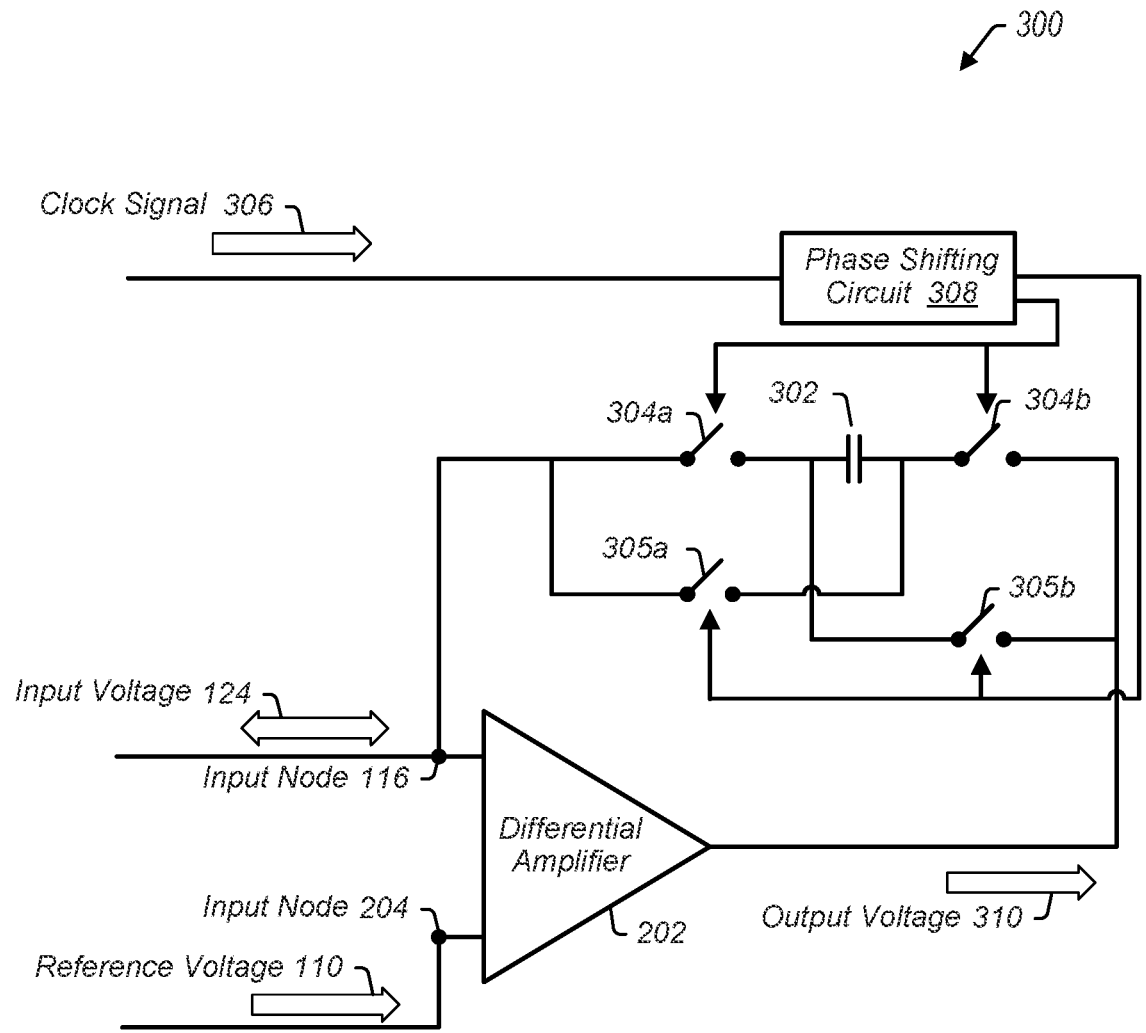
FIG. 3 is a block diagram of another embodiment of a buffer circuit.

FIG. 3 is a block diagram of a different embodiment of a buffer circuit. Buffer circuit 300 can implement one embodiment of buffer circuit 106 of FIG. 1. Buffer circuit 300 differs from buffer circuit 200 of FIG. 2 in that the feedback path of differential amplifier 202 includes a capacitor 302 and a switching network including switches 304a, 304b, 305a and 305b. Switches 304a and 304b are on either side of capacitor 302 along one path through capacitor 302, while switches 305a and 305b are on either side of capacitor 302 along another path through capacitor 302. Switches 304a/b and 305a/b are driven using a clock signal 306. Phase shifting circuit 308 in the path of clock signal 306 is configured to alter the clock signal waveform so that switch pairs 304a/b and 305a/b are never closed at the same time, but instead are actuated alternately so that the direction that capacitor 302 is connected in switches back and forth. In an embodiment, the charge stored in the capacitors is not affected by the switch toggling in the manner of a switched-capacitor circuit. In an embodiment, the clock signal waveforms actuating the two groups of switches are non-overlapping waveforms having the same period but not the same phase. The two phases' durations may be affected by coupled circuit elements, such as divider circuits or load elements, not shown in FIG. 3. Clock signal configurations different than that shown in FIG. 3 may be used to generate clock signal waveforms for driving switches 304a/b and 305a/b in other embodiments. Switching networks different than that shown in FIG. 3 may be used to generate a sawtooth waveform in some embodiments.

Capacitor 302 and other capacitors described herein may be implemented as metal-oxide-metal (MOM) capacitors, metal-insulator-metal capacitors, or any other suitable capacitor structures available in a semiconductor manufacturing process used to fabricate buffer circuit 300. Switches 304a/b and 305a/b and other switches described herein may be implemented as pass gates, single MOSFETs, or any other suitable switching devices or elements. Clock signal 306 may be implemented using various types of oscillator circuits, including ring oscillator or relaxation oscillator (such as LC oscillator) circuits. In an embodiment, clock signal 306 is produced by an oscillator circuit within an oscillator subsystem, such as the oscillator subsystem described in connection with FIG. 5.

Buffer circuit 200 of FIG. 2 is configured to produce a constant output current 126. By contrast, buffer circuit 300 of FIG. 3 is configured to produce a time-varying output voltage 310. In an embodiment, the alternating charging and discharging of capacitor 302 results in a sawtooth output waveform for output voltage 310. The amplitude of the waveform depends on the frequency of clock signal 306. For example, closing the switches 304a/b will cause the charging of capacitor 302. In some embodiments this causes the output voltage 310 to rise. Then, at the following clock signal edge, switches 304a/b are opened, and switches 305a/b are closed. As a result, output voltage 310 falls immediately. Considering the current flowing in the input node 124 to be unaffected by the change in the switches' configuration, the current flowing in capacitor 302 is not altered and the output voltage 310 starts to rise again. Repetition of such a sequence may result in a sawtooth waveform for output voltage 310.

In an embodiment, time-varying voltage 310 can be sampled at times one period (or another integer number of periods) of clock signal 306 apart, with the value of the sampled voltage depending on the frequency of clock signal 306. For example, the voltage reached at the end of one phase of the clock (just before switch pair 304a/b opens again) will depend on the frequency of clock signal 306, as long as the frequency is high enough that the output voltage 310 is not saturated to the supply voltage or to ground. A higher frequency means a shorter time for the capacitor to be charged, or discharged, and a smaller output voltage at the end of the cycle. A lower frequency means a longer time for the capacitor to charge, leading to a higher output voltage. As described further, buffer circuit 300 provides a time-varying output voltage that is proportional to the supply voltage and can be sampled to produce a voltage that reflects the frequency of a clock used to generate the time-varying output voltage. In an embodiment, the output voltage can be sampled to produce a voltage proportional to the clock period. As described further in connection with FIG. 5 and FIG. 6, buffer circuit 300 can be used in producing a control signal for a voltage-controlled oscillator (VCO), as part of a frequency control loop having a reduced dependence on temperature and supply voltage.

It is noted that the repeated transfer of charge across capacitor 302 is equivalent, on average, to a current flow through the feedback connection. The feedback current can be expressed as the amount of charge transferred per period of the clock, or the capacitance of the capacitor multiplied by the change in voltage across the capacitor divided by the period, as in Equation 5.

$$I_{feedback} = \frac{\Delta V_{302} \cdot C_{302}}{T_{clock}} \quad (5)$$

For an ideal amplifier the feedback current is equal to the current entering input node 116, described in Equation 1. It follows that the feedback current and output voltage 310 of buffer circuit 300 exhibit the reduced temperature dependence described in connection with buffer circuit 200 of FIG. 2, in embodiments for which resistor values are chosen to set the temperature dependence to zero at the fixed temperature. The feedback current and output voltage 310 are also proportional to the supply voltage as a result of the supply voltage dependence of reference voltage 110. This ratiometric property is important when considering the amplitude of output voltage 310. Because the feedback current is proportional to supply voltage, and the frequency of output voltage 310 depends on the clock signal frequency, the amplitude of the output sawtooth waveform at node 310 is proportional to the supply voltage. Using Equation 5 and that frequency is the reciprocal of the period, the amplitude of the output voltage 310 is given by Equation 6. As discussed further in connection with FIG. 5, the threshold used in "locking" of the frequency of output voltage 310 (when buffer circuit 300 is used in a frequency-locked oscillator sub-system) is also proportional to supply voltage in some embodiments, so that the supply voltage independence of the locked frequency is obtained.

$$\Delta V_{302} = \frac{I_{feedback}}{f \cdot C_{302}} \quad (6)$$

Figure 4:
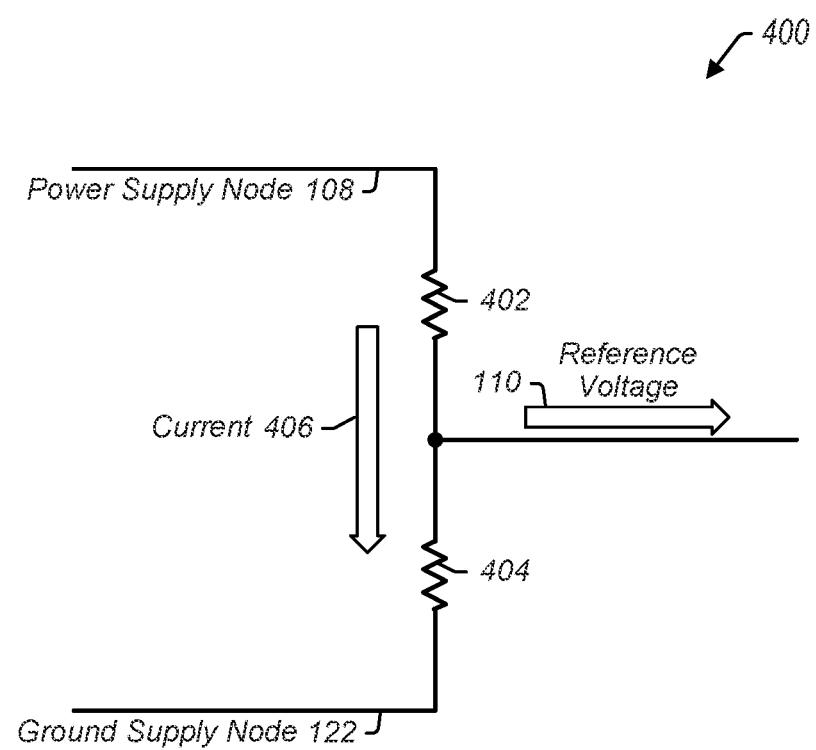
FIG. 4 is a block diagram of an embodiment of a divider circuit.

Turning to FIG. 4, a block diagram of an embodiment of a divider circuit is depicted. Divider circuit 400 can implement one embodiment of divider circuit 102 of FIG. 1. As illustrated, divider circuit 400 includes resistors 402 and 404 coupled in series between power supply node 108 and ground supply node 122. A current 406 flows through resistors 402 and 404 causing a voltage drop across each resistor and setting reference voltage 110 to the voltage of the node between resistors 402 and 404. That reference voltage 110 is proportional to supply voltage $V_{supply}$ (the voltage difference between nodes 108 and 122) is shown by the voltage divider expression of Equation 7. Values of resistors 402 and 404 are chosen to provide the desired value of reference voltage 110. In an embodiment, reference voltage 110 is set to approximately one half of the supply voltage, but other values may be used for reference voltage 110 in other embodiments.

$$V_{110} = \frac{R_{404}}{R_{402} + R_{404}} \cdot V_{supply} \quad (7)$$

In various embodiments, resistors 402 and 404 may be implemented using polysilicon, metal or any other suitable material available in a semiconductor manufacturing process. Moreover, although shown as single resistors, resistors 402 and 404, as well as all other resisters described herein, may in various embodiments be implemented using any suitable series and/or parallel combination of resistors. It is noted that the elements used to divide the supply voltage and set the value of reference voltage 110 do not need to be resistors as shown in FIG. 4. Other elements such as capacitors, diodes, transistors or portions thereof may be used in other embodiments. Such elements may be implemented using conductive or insulating materials, as appropriate, or combinations of these. In an embodiment, materials that are available in a semiconductor fabrication process may be used in various embodiments.

Figure 5:
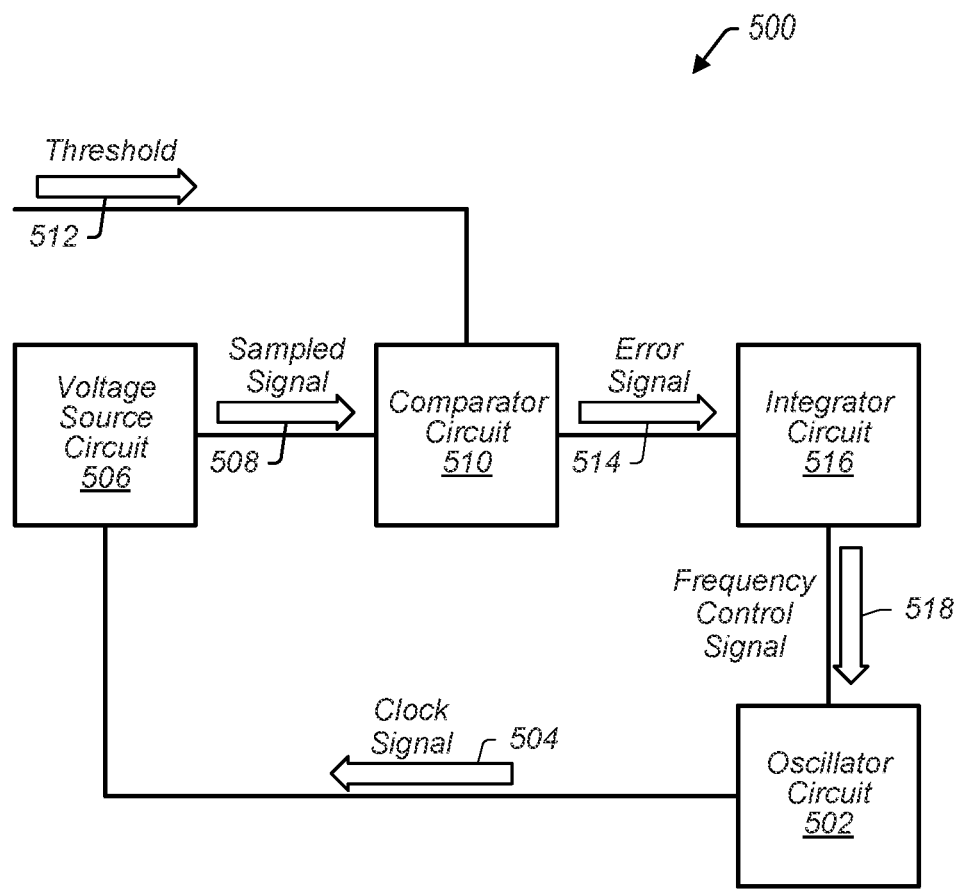
FIG. 5 is a block diagram of an embodiment of an oscillator sub-system.

Turning to FIG. 5, a block diagram of an oscillator subsystem is depicted. As illustrated, oscillator subsystem 500 includes oscillator circuit 502, voltage source circuit 506, comparator circuit 510, and integrator circuit 516.

Oscillator circuit 502 is configured to generate clock signal 504, where the frequency of clock signal 504 is adjusted using frequency control signal 518. In an embodiment, oscillator circuit 502 is implemented using a ring oscillator circuit in which frequency control signal 518 adjusts a bias current and, therefore, propagation speed of the ring oscillator stages. Oscillator circuit 502 may be implemented using other types of oscillator circuit in other embodiments, such as an LC oscillator circuit having its resonant frequency adjusted using frequency control signal 518. For example, frequency control signal 518 may be applied to a control input of a transistor or other switch element setting a bias current for an LC oscillator circuit. Oscillator circuit 502 may also include any or all of level shifting circuitry, scaling circuitry or frequency divider circuitry in various embodiments.

Voltage source circuit 506 is configured to generate a sampled signal 508 that reflects the frequency of clock signal 504. In an embodiment, a voltage of sampled signal 508 is proportional to the period of clock signal 504. Voltage source circuit 506 employs current source 100 of FIG. 1 to make sampled signal 508 proportional to supply voltage and relatively independent of temperature. Implementation of voltage source circuit 506 is described further in connection with the embodiment shown in FIG. 6.

Comparator circuit 510 is configured to compare sampled signal 508 to a threshold 512 to generate an error signal 514. Threshold 512 sets the target frequency for oscillator sub-system 500. Like sampled signal 508, threshold 512 is proportional to the supply voltage of oscillator sub-system 500. In an embodiment, threshold 512 is established using an additional voltage divider circuit similar to divider circuit 400 of FIG. 4. Such a voltage divider circuit is in some embodiments configured to set threshold 512 to a different level than reference voltage 110. Threshold 512 may be set to a level in between the anticipated maximum and minimum values of sampled signal 508. In an embodiment, voltage source circuit 506 includes buffer circuit 300 of FIG. 3 and the maximum and minimum values of sampled signal 508 correspond to maximum and minimum values of time-varying output voltage 310. As just one example, in an embodiment for which reference voltage 110 of buffer circuit 300 is set to approximately one-half of the supply voltage, threshold 512 may be set to approximately two-thirds of the supply voltage. Comparator circuit 510 can in one embodiment employ a difference circuit and generate error signal 514 by subtracting each value of sampled signal 508 from the corresponding value of threshold 512. A switched-capacitor circuit may be used as a difference circuit in some embodiments, but other types of difference circuits may also be used.

Integrator circuit 516 is configured to integrate error signal 514 to produce frequency control signal 518. For each sample voltage within sampled signal 508, an error signal value is generated by comparator circuit 510. Integrator circuit 516 effectively adds each error signal value to the previous integrated error signal, and the level of frequency control signal 518 is increased, decreased or left unchanged according to the change in the integrated error signal. If frequency control signal 518 changes, the frequency of clock signal 504 is changed by oscillator circuit 502. In an embodiment, integrator circuit 516 integrates error signal 514 by adding or removing charge from a capacitor, and a voltage across the capacitor is used for frequency control signal 518.

In some embodiments, a switched-capacitor discrete-time integrator (DTI) circuit may be used to implement both comparator circuit 510 and integrator circuit 516. In an embodiment where voltage source circuit 506 includes buffer circuit 300, such a switched-capacitor DTI circuit may use the same clock frequency for switching as clock signal 306. In such an embodiment the DTI circuit can sample time-varying output voltage 310 to create sampled signal 508 and also sample values of threshold 512, comparing corresponding samples to obtain samples of the difference between threshold 512 and frequency-dependent output voltage 310. These samples of error signal 514 may be stored as charge in a feedback capacitor in a differential first stage of the DTI circuit and then forwarded to an integrator stage of the DTI circuit for combination with charge representing previous samples of error signal 514. Other types of comparator and integrator circuits may be used for comparator circuit 510 and integrator circuit 516 in other embodiments, however.

Operation of oscillator sub-system 500 implements an oscillator circuit controlled by a frequency-locked loop, where the target frequency for the loop is set by the value of threshold 512. In an embodiment, comparator circuit 510 and integrator circuit 516 combine to form a frequency control circuit within oscillator sub-system 500. Such a frequency control circuit may in some embodiments be considered to include the sampling circuit used to provide sampled signal 508. As discussed further in connection with FIG. 6, use of buffer circuit 300 to implement voltage circuit 506 may result in a frequency-locked loop having very little dependence on temperature or supply voltage. This near-independence of the loop with regard to temperature and supply voltage variation may allow improved oscillator frequency control during circuit operation, and less "spread" between frequencies of clock signals used in different parts of a circuit. In addition, frequency variation caused by effects of temperature or supply voltage variation on oscillator circuit 502 itself can be more effectively corrected by the frequency-locking loop of oscillator subsystem 500, since the loop mechanism is relatively immune to the temperature and voltage variations.

In embodiments in which threshold 512 is set using a voltage divider circuit, the target frequency can be adjusted during a testing and repair phase of the semiconductor fabrication process used to manufacture oscillator sub-system 500. In a manner similar to that described in connection with divider circuit 104 of FIG. 1, resistance values associated with the resistors or other elements used in a voltage divider circuit setting threshold 512 can be adjusted by methods such as laser trimming if testing shows the target frequency to be inaccurate due to process variations, or if a change in target frequency is desired for other reasons.

Figure 6:
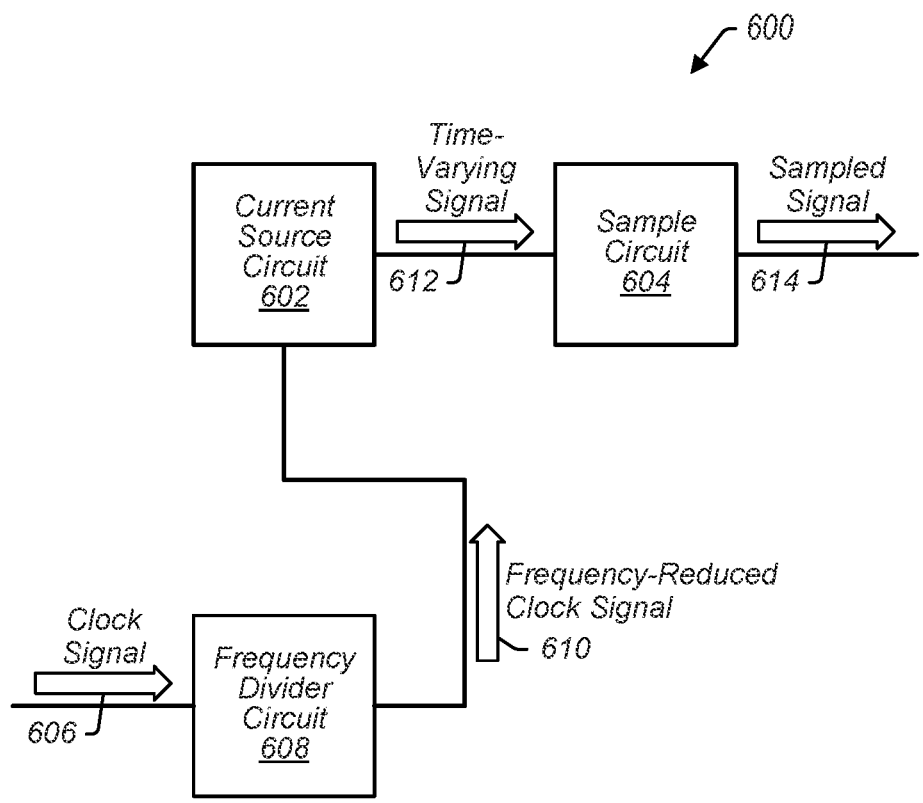
FIG. 6 is a block diagram of an embodiment of a voltage source circuit.

Turning to FIG. 6, a block diagram of an embodiment of a voltage source circuit is depicted. Voltage source circuit 600 can implement an embodiment of voltage source circuit 506 of FIG. 5. As illustrated, voltage source circuit 600 includes current source circuit 602 and sample circuit 604. In the illustrated embodiment, voltage source circuit 600 also includes a frequency divider circuit 608 for generating a frequency-reduced clock signal 610 from clock signal 606. When voltage source circuit 600 is used within oscillator sub-system 500, clock signal 606 is clock signal 504 generated by oscillator circuit 502. Frequency divider circuit 608 generates frequency-reduced clock signal 610 for use by the frequency-locking control loop of oscillator sub-system 500. Frequency divider circuit 608 is configured in various embodiments to provide integer division, fractional division or a combination of these, implemented using one or more flip-flops, counters or other combinational or sequential logic circuits. Counters, adders, flip-flops, registers and other digital circuits referenced herein can include logical gates formed from switch devices of any suitable technology, including field effect and bipolar transistor technologies, or any other suitable transconductance devices. Any suitable transistor types may be used, including single-gate, multiple-gate or three-dimensional MOSFETs, where three-dimensional MOSFETs may include devices such as FinFETs or GAAFETs. In other embodiments, frequency divider circuit 608 may be omitted and clock signal 606 provided directly to current source circuit 602.

Current source circuit 602 is configured to generate time-varying signal 612 using a clock signal (either clock signal 606 or frequency-reduced clock signal 610, as described above). In an embodiment, current source circuit 602 is implemented as current source 100 of FIG. 1 using buffer circuit 300 of FIG. 3. In such an embodiment, time-varying signal 612 generated by current source circuit 602 is output voltage 310 described in connection with FIG. 3. Time-varying signal 612 is therefore a sawtooth voltage waveform having a value proportional to the supply voltage in some embodiments. In such embodiments time-varying signal 612 can be sampled at times that are one period (or another integer number of periods) of the sawtooth waveform apart to produce values related to the frequency of the sawtooth waveform. In some embodiments the sampling produces values proportional to the period of the waveform.

Sample circuit 604 is configured to sample time-varying signal 612 at times that are one or another integer number of periods apart, to produce sampled signal 614. When voltage source circuit 600 is used within oscillator sub-system 500, sampled signal 614 is sampled signal 508 of FIG. 5. In an embodiment, sample circuit 604 is implemented as a sample and hold circuit including a capacitor coupled using a switch to the output of a buffer amplifier.

It is noted that FIGS. 1-6 depict example implementations of the circuits and systems disclosed herein. In some embodiments the circuits shown may be split into multiple circuits, or the functions of multiple circuits may be performed by a single circuit. For example, the function of sample circuit 604 may in some embodiments be performed by a comparator circuit such as comparator circuit 510. As another example, the (optional) frequency division function of frequency divider circuit 608 may be included within oscillator circuit 502 in some embodiments.

To summarize, an apparatus is disclosed for generating a ratiometric current having a reduced temperature dependence. In one embodiment, the apparatus includes a first divider circuit, a second divider circuit and a buffer circuit. The first divider circuit is configured to generate a reference voltage using a voltage level of a power supply node. The second divider circuit includes a first resistor with a first temperature coefficient and a second resistor with a second temperature coefficient. The first resistor is configured to generate a first current using an input voltage and the voltage level of the power supply node and the second resistor is configured to generate a second current using the input voltage. The buffer circuit is configured to generate the input voltage using the reference voltage and generate an output current using a difference between the first current and the second current.

An embodiment of the buffer circuit includes a differential amplifier circuit that includes a first input node, a second input node and an output node, where the output node is coupled to the first input node. A different embodiment of the buffer circuit also includes a differential amplifier circuit that includes a first input node, a second input node and an output node, but also includes a capacitor and a plurality of switches driven using a clock signal and configured to couple the capacitor between the output node and the first input node.

An apparatus for generating a frequency-controlled clock signal is also disclosed. In one embodiment, the apparatus includes an oscillator circuit, a voltage-source circuit, and a frequency control circuit. The oscillator circuit is configured to generate a clock signal. The voltage-source circuit includes a first resistor with a first temperature coefficient and a second resistor with a second temperature coefficient. The voltage-source circuit is configured to generate an input voltage using a reference voltage, generate a first current using the input voltage and a voltage level of a power supply node, generate a second current using the second resistor and the input voltage, generate an output current using the first current and the second current, and generate a time-varying output voltage using the output current and the clock signal.

The frequency control circuit is configured to generate a frequency control signal using the time-varying output voltage, and the oscillator circuit is further configured to adjust a frequency of the clock signal using the frequency control signal. In a further embodiment, the frequency control circuit is configured to sample, using the clock signal, the time-varying output voltage to generate a sampled signal, generate an error signal using the sampled signal and a threshold signal, and integrate the error signal to generate a frequency control signal. An embodiment of the voltage-source circuit includes a differential amplifier circuit, a capacitor, and a plurality of switches driven using the clock signal and configured to couple the capacitor between the output node and the first input node.

Figure 7:
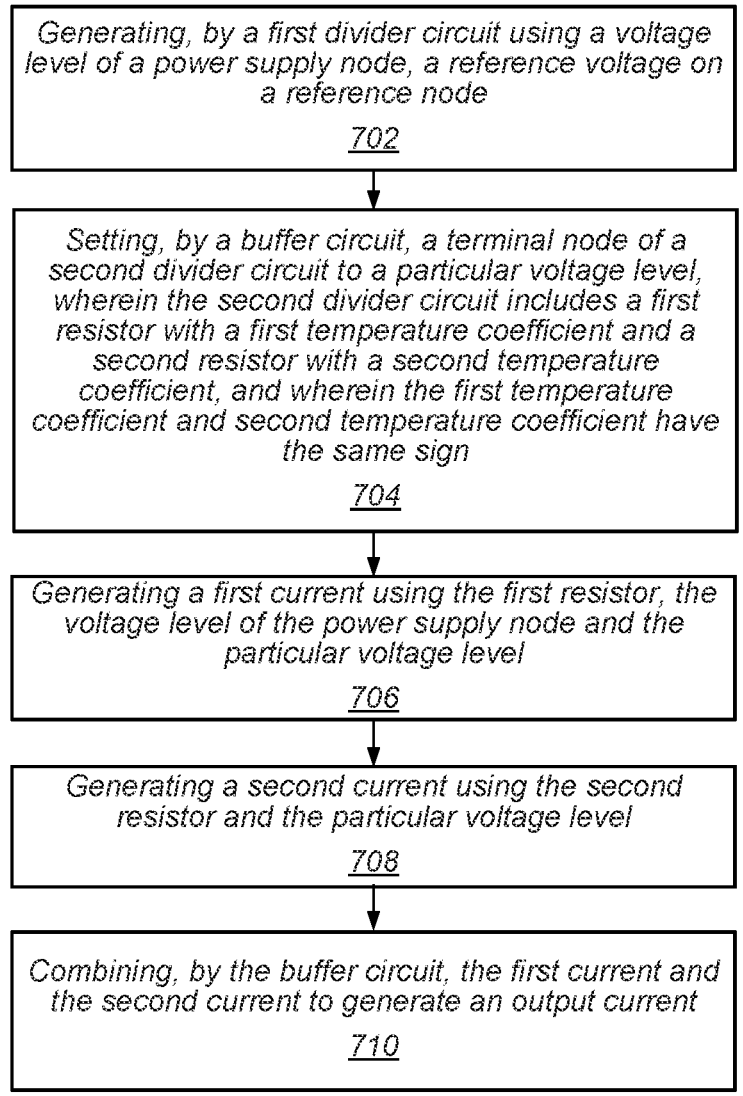
FIG. 7 is a flow diagram illustrating an embodiment of a method for operating a current source or voltage source circuit.

Turning to FIG. 7, a flow diagram depicting an embodiment of a method for operating a current or voltage source circuit is illustrated. The method may be applied to various current or voltage source circuits, such as current or voltage source circuit 100 illustrated in FIG. 1.

Method 700 includes, in block 702, generating, by a first divider circuit using a voltage level of a power supply node, a reference voltage on a reference node. In an embodiment, the first divider circuit includes two resistors coupled in series between a power supply node and ground supply node and generating the reference voltage includes generating a reference current having a value inversely proportional to a sum of the respective resistance values of the two resistors. In a further embodiment, the two resistors may have the same resistance value. Divider circuit 102 of FIG. 1 and divider circuit 400 of FIG. 4 illustrate embodiments of the first divider circuit.

The method further includes, in block 704, setting, by a buffer circuit, a terminal node of a second divider circuit to a particular voltage level. The second divider circuit includes a first resistor with a first temperature coefficient and a second resistor with a second temperature coefficient. In an embodiment, the first temperature coefficient and the second temperature coefficient have the same sign. In some embodiments, the buffer circuit includes a differential amplifier circuit that includes a first input node, a second input node and an output node, where the output node is coupled to the first input node. In such an embodiment, the method may also include performing a comparison of respective voltage levels of the first input node and the second input node and generating the particular voltage level using a result of the comparison.

Method 700 further includes generating a first current using the first resistor, the voltage level of the power supply node and the particular voltage level (block 706). The method also includes, at block 708, generating a second current using the second resistor and the particular voltage level. In an embodiment, the first current and second current are generated using the second divider circuit, where the terminal node set to the particular voltage level is the node between the first resistor and second resistor. Divider circuit 104 of FIG. 1 illustrates an embodiment of the second divider circuit.

The method further includes combining, by the buffer circuit, the first current and second current to generate an output current (block 710). In an embodiment in which the buffer circuit is a buffer-connected differential amplifier, such as buffer circuit 200 of FIG. 2, the output current is (assuming ideal operational amplifier behavior) the same as the current entering the input node of the amplifier that is coupled to the output. If that input node is coupled to the terminal node of the second divider circuit, the output current is the portion of the first current flowing into the buffer circuit rather than continuing, as the second current, through the resistor string of the second divider circuit. The output current magnitude in this embodiment is equal to the first current magnitude minus the second current magnitude (the first and second currents are combined to generate the output current in the sense of being brought together, rather than in the sense of their magnitudes being mathematically added).

Because the output current depends on subtraction of one of the currents in the second divider circuit from the other, values of the first and second resistor at a fixed temperature (such as 20° C.) can be chosen such that the change with temperature of the output current goes to zero for temperature changes around the fixed temperature, even when the temperature coefficients of the first and second resistors have the same sign. This may provide a simpler and easier-to-manufacture circuit design for a temperature-independent current source (or at least a current source with reduced temperature dependence). Use of divider circuits to establish input voltages for the buffer circuit results in an output current that is proportional to the supply voltage. This ratiometric property may allow the current source to be used in a frequency control loop for an oscillator subsystem, where the control loop has a low dependence on both temperature and supply voltage variations.

In some embodiments, the method of operating a current source or voltage source can further include generating a sawtooth output signal using the output current. For example, the buffer circuit in some embodiments may include a differential amplifier circuit that includes a first input node, a second input node and an output node, where the first input node is coupled to the terminal node and the second input node is coupled to the reference node. In such an embodiment, generating the sawtooth output signal may include coupling a capacitor between the first input node and the output node using a switched capacitor arrangement driven using a clock signal. Use of buffer circuit 300 in FIG. 3 as the buffer circuit is an example of an embodiment for generating a sawtooth output signal. Because buffer circuit 300 is a switched-capacitor circuit, the output current is an average current achieved by repeatedly moving packets of charge into and out of the feedback capacitor. The sawtooth output voltage is generated by the operation of the differential amplifier as the connection direction of the capacitor is periodically reversed.

Figure 8:
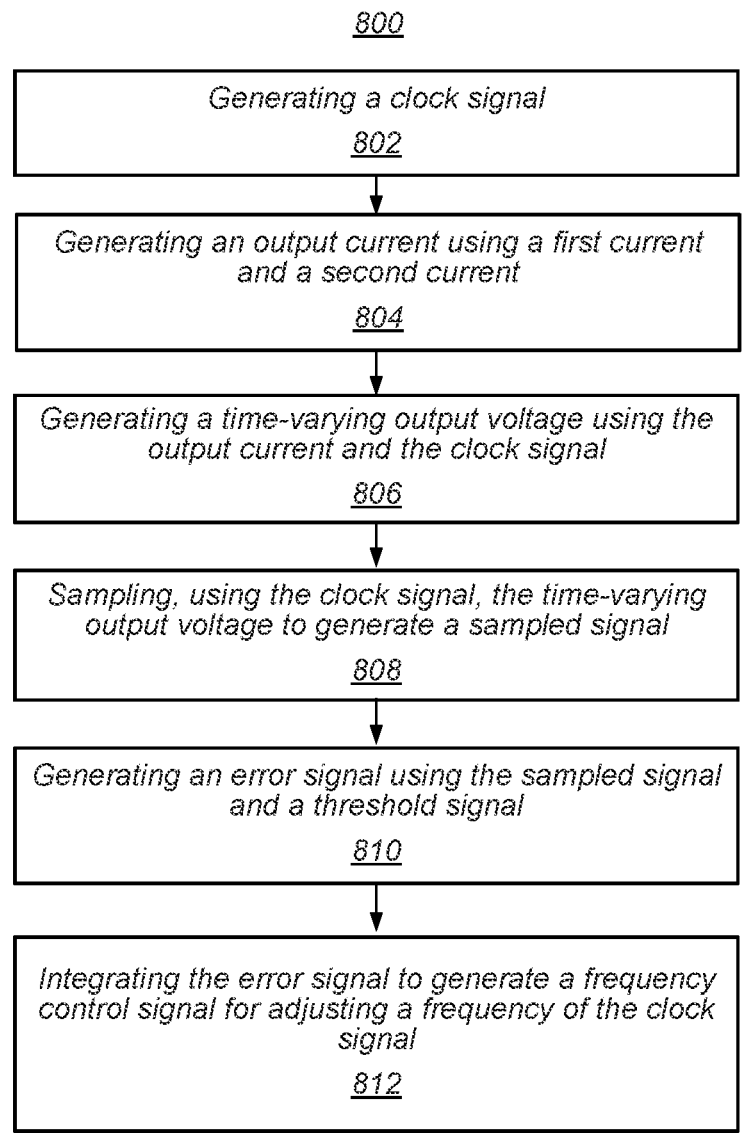
FIG. 8 is a flow diagram illustrating an embodiment of a method for operating an oscillator sub-system.

A flow diagram depicting an embodiment of a method for operating an oscillator sub-system is shown in FIG. 8. The method may be applied to various oscillator sub-systems, such as sub-system 500 illustrated in FIG. 5.

Method 800 includes, in block 802, generating a clock signal. In an embodiment, the clock signal is generated using an oscillator having a frequency control input, such as a VCO. The method continues with generating an output current using a first current and a second current (block 804) and generating a time-varying output voltage using the output current and the clock signal (block 806). In an embodiment, the output current and time-varying output voltage are generated using a current source circuit within a voltage source circuit, such as current source circuit 602 within voltage source circuit 600 of FIG. 6.

The method further includes, in block 808, sampling, using the clock signal, the time-varying output voltage to generate a sampled signal. In an embodiment, the sampling is performed using a sample circuit within a voltage source circuit, such as sample circuit 604 within voltage source circuit 600 of FIG. 6. In another embodiment, the sampling may be performed within a comparator circuit such as comparator circuit 510 of FIG. 5.

Method 800 also includes generating an error signal using the sampled signal and a threshold signal (block 810) and integrating the error signal to generate a frequency control signal for adjusting a frequency of the clock signal (block 812). The error signal is, in some embodiments, proportional to a difference between the threshold signal and the sampled signal. In an embodiment, the error signal is generated by a comparator circuit such as comparator circuit 510 and integrated by an integrator circuit such as integrator circuit 516. In some embodiments the comparison of the sampled signal and threshold signal and integration of the error signal may be done with a switched-capacitor DTI circuit, which may also be configured to perform the sampling of the output voltage in some embodiments.

Figure 9:
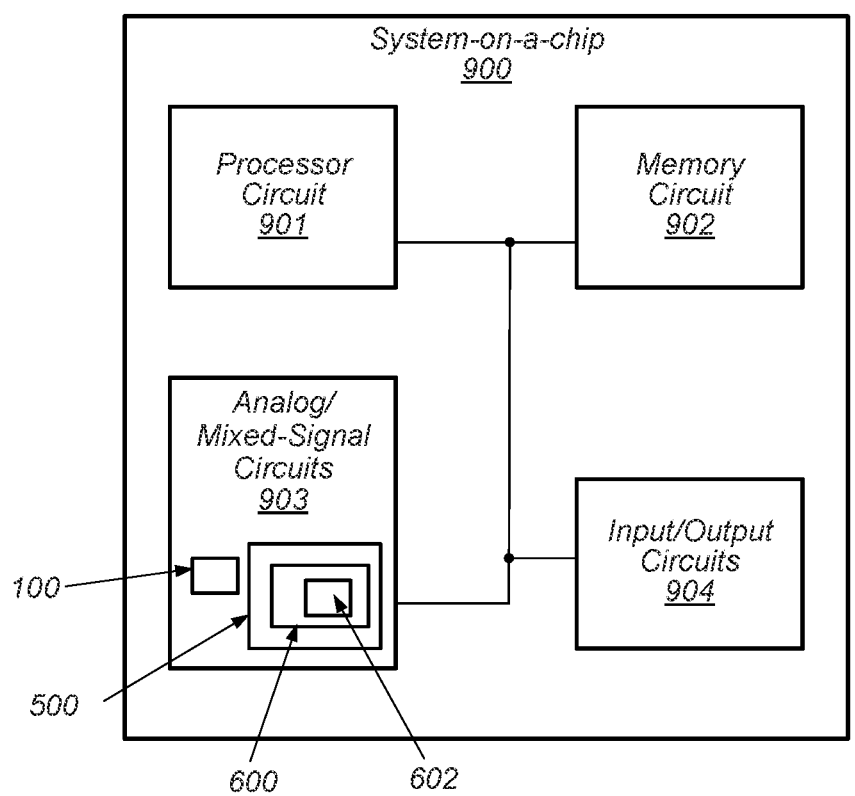
FIG. 9 is a block diagram of a system-on-a-chip.

A block diagram of a system-on-a-chip (SoC) is illustrated in FIG. 9. In the illustrated embodiment, the SoC 900 includes processor circuit 901, memory circuit 902, analog/mixed-signal circuits 903, and input/output circuits 904.

Processor circuit 901 may, in various embodiments, be representative of a general-purpose processor that performs computational operations. For example, processor circuit 901 may be a central processing unit (CPU) such as a microprocessor, a microcontroller, an application-specific integrated circuit (ASIC), or a field-programmable gate array (FPGA).

Memory circuit 902 may, in various embodiments, include any suitable type of memory such as a Dynamic Random-Access Memory (DRAM), a Static Random-Access Memory (SRAM), a Read-Only Memory (ROM), an Electrically Erasable Programmable Read-only Memory (EEPROM), or a non-volatile memory, for example. It is noted that although a single memory circuit is illustrated in FIG. 9, in other embodiments, any suitable number of memory circuits may be employed.

Analog/mixed-signal circuits 903 may include circuits such as a crystal oscillator circuit, a phase-locked loop circuit, an analog-to-digital converter (ADC) circuit, and a digital-to-analog converter (DAC) circuit (all not shown). In various embodiments, analog/mixed-signal circuits 903 may include one or more instances of current or voltage source circuit 100 configured to generate a current ratiometric with supply voltage and having a reduced temperature dependence. In some embodiments, circuit 100 may be implemented using buffer circuit 200 of FIG. 2 to provide a current source for any of various applications within analog/mixed-signal circuits 903. In other embodiments, circuit 602, implemented using buffer circuit 300 of FIG. 3, may be used within an instance of voltage source circuit 600 as part of an oscillator sub-system 500. One or more instances of oscillator sub-system 500 may be used in providing clock signals to various circuit blocks within system-on-a-chip 900. These clock signals may have a reduced spread in frequency because of the reduced dependence of the generated clock signal frequencies on temperature and supply voltage.

Input/output circuits 904 may be configured to coordinate data transfer between SoC 900 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, input/output circuits 904 may be configured to implement a version of Universal Serial Bus (USB) protocol or IEEE 1394 (Firewire®) protocol.

Input/output circuits 904 may also be configured to coordinate data transfer between SoC 900 and one or more devices (e.g., other computing systems or integrated circuits) coupled to SoC 900 via a network. In one embodiment, input/output circuits 904 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, input/output circuits 904 may be configured to implement multiple discrete network interface ports.

Figure 10:
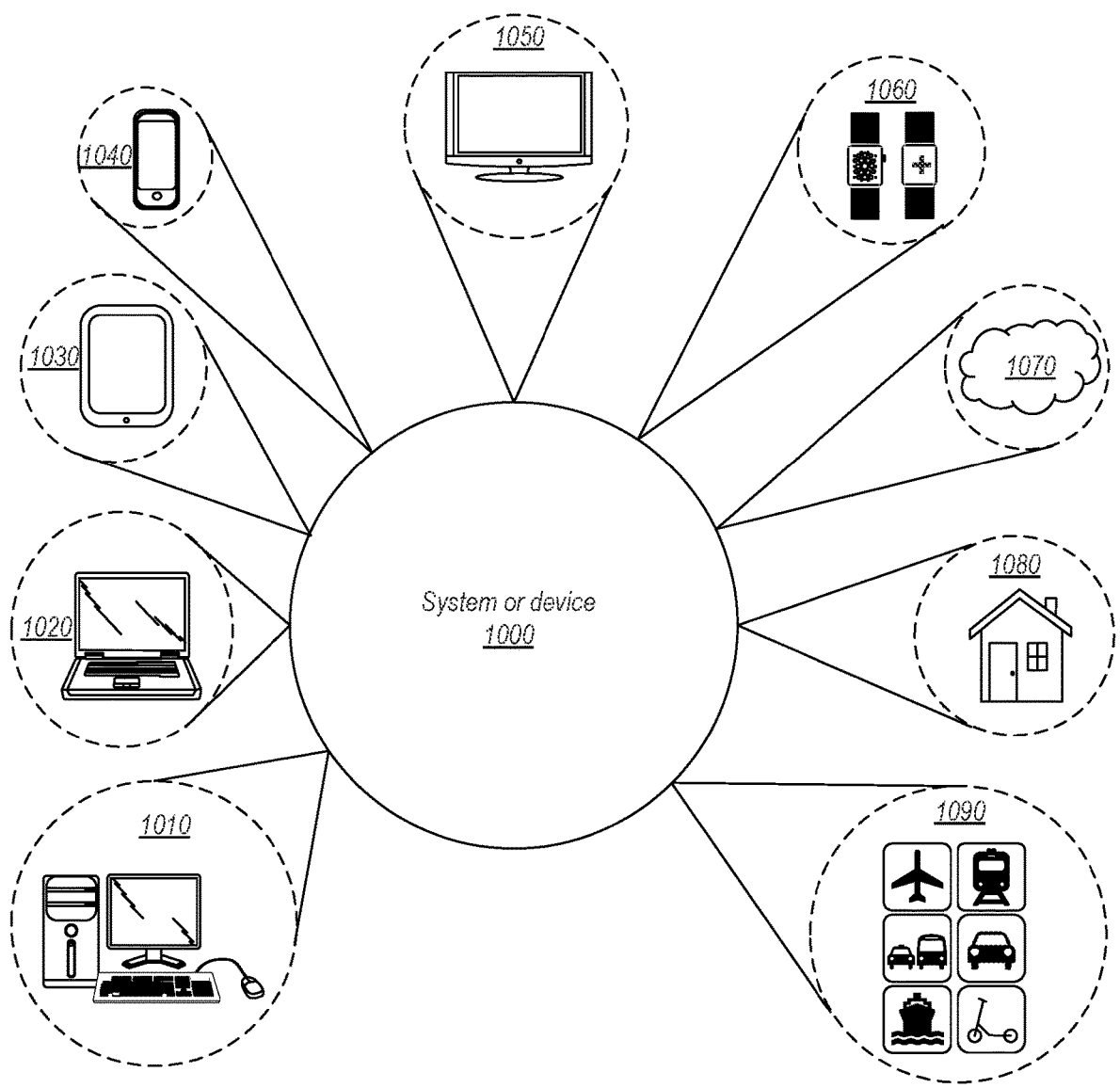
FIG. 10 is a block diagram of various embodiments of computer systems that may include current source or voltage source circuits.

Turning now to FIG. 10, various types of systems that may include any of the circuits, devices, or systems discussed above are illustrated. System or device 1000, which may incorporate or otherwise utilize one or more of the techniques described herein, may be utilized in a wide range of areas. For example, system or device 1000 may be utilized as part of the hardware of systems such as a desktop computer 1010, laptop computer 1020, tablet computer 1030, cellular or mobile phone 1040, or television 1050 (or set-top box coupled to a television).

Similarly, disclosed elements may be utilized in a wearable device 1060, such as a smartwatch or a health-monitoring device. Smartwatches, in many embodiments, may implement a variety of different functions—for example, access to email, cellular service, calendar, health monitoring, etc. A wearable device may also be designed solely to perform health-monitoring functions, such as monitoring a user's vital signs, performing epidemiological functions such as contact tracing, providing communication to an emergency medical service, etc. Other types of devices are also contemplated, including devices worn on the neck, devices implantable in the human body, glasses or a helmet designed to provide computer-generated reality experiences such as those based on augmented and/or virtual reality, etc.

System or device 1000 may also be used in various other contexts. For example, system or device 1000 may be utilized in the context of a server computer system, such as a dedicated server or on shared hardware that implements a cloud-based service 1070. Still further, system or device 1000 may be implemented in a wide range of specialized everyday devices, including devices 1080 commonly found in the home such as refrigerators, thermostats, security cameras, etc. The interconnection of such devices is often referred to as the "Internet of Things" (IoT). Elements may also be implemented in various modes of transportation. For example, system or device 1000 could be employed in the control systems, guidance systems, entertainment systems, etc. of various types of vehicles 1090.

The applications illustrated in FIG. 10 are merely exemplary and are not intended to limit the potential future applications of disclosed systems or devices. Other example applications include, without limitation: portable gaming devices, music players, data storage devices, unmanned aerial vehicles, etc.

Figure 11:
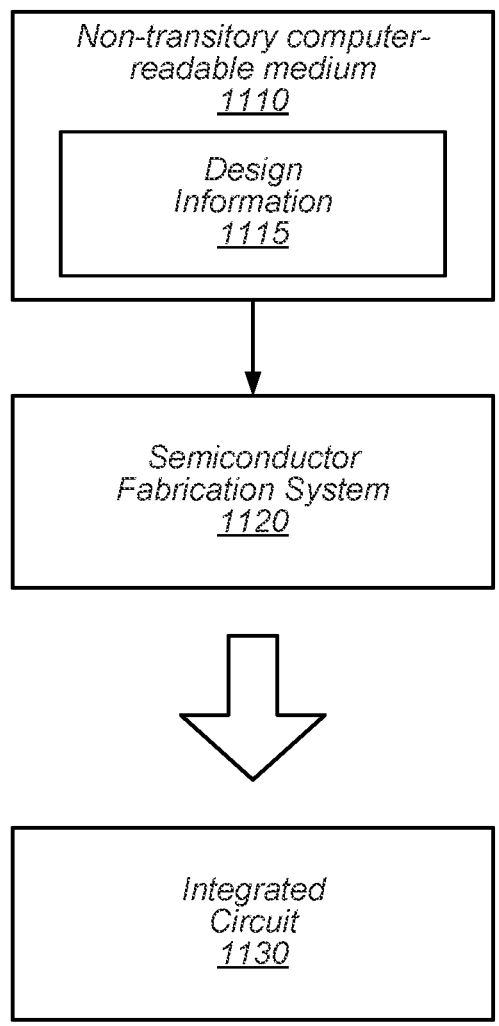
FIG. 11 illustrates an example of a non-transitory computer-readable storage medium that stores circuit design information.

FIG. 11 is a block diagram illustrating an example non-transitory computer-readable storage medium that stores circuit design information, according to some embodiments. In the illustrated embodiment, semiconductor fabrication system 1120 is configured to process the design information 1115 stored on non-transitory computer-readable storage medium 1110 and fabricate integrated circuit 1130 based on the design information 1115.

Non-transitory computer-readable storage medium 1110, may comprise any of various appropriate types of memory devices or storage devices. Non-transitory computer-readable storage medium 1110 may be an installation medium, e.g., a CD-ROM, floppy disks, or tape device; a computer system memory or random access memory such as DRAM, DDR RAM, SRAM, EDO RAM, Rambus RAM, etc.; a non-volatile memory such as a Flash memory, magnetic media, e.g., a hard drive, or optical storage; registers, or other similar types of memory elements, etc. Non-transitory computer-readable storage medium 1110 may include other types of non-transitory memory as well or combinations thereof. Non-transitory computer-readable storage medium 1110 may include two or more memory mediums, which may reside in different locations, e.g., in different computer systems that are connected over a network.

Design information 1115 may be specified using any of various appropriate computer languages, including hardware description languages such as, without limitation: VHDL, Verilog, SystemC, SystemVerilog, RHDL, M, MyHDL, etc. Design information 1115 may be usable by semiconductor fabrication system 1120 to fabricate at least a portion of integrated circuit 1130. The format of design information 1115 may be recognized by at least one semiconductor fabrication system, such as semiconductor fabrication system 1120, for example. In some embodiments, design information 1115 may include a netlist that specifies elements of a cell library, as well as their connectivity. One or more cell libraries used during logic synthesis of circuits included in integrated circuit 1130 may also be included in design information 1115. Such cell libraries may include information indicative of device or transistor level netlists, mask design data, characterization data, and the like, of cells included in the cell library.

Integrated circuit 1130 may, in various embodiments, include one or more custom macrocells, such as memories, analog or mixed-signal circuits, and the like. In such cases, design information 1115 may include information related to included macrocells. Such information may include, without limitation, schematics capture database, mask design data, behavioral models, and device or transistor level netlists. As used herein, mask design data may be formatted according to graphic data system (GDSII), or any other suitable format.

Semiconductor fabrication system 1120 may include any of various appropriate elements configured to fabricate integrated circuits. This may include, for example, elements for depositing semiconductor materials (e.g., on a wafer, which may include masking), removing materials, altering the shape of deposited materials, modifying materials (e.g., by doping materials or modifying dielectric constants using ultraviolet processing), etc. Semiconductor fabrication system 1120 may also be configured to perform various testing of fabricated circuits for correct operation.

In various embodiments, integrated circuit 1130 is configured to operate according to a circuit design specified by design information 1115, which may include performing any of the functionality described herein. For example, integrated circuit 1130 may include any of various elements shown or described herein. Further, integrated circuit 1130 may be configured to perform various functions described herein in conjunction with other components. Further, the functionality described herein may be performed by multiple connected integrated circuits.

As used herein, a phrase of the form "design information that specifies a design of a circuit configured to . . . " does not imply that the circuit in question must be fabricated in order for the element to be met. Rather, this phrase indicates that the design information describes a circuit that, upon being fabricated, will be configured to perform the indicated actions or will include the specified components.

The present disclosure includes references to "embodiments," which are non-limiting implementations of the disclosed concepts. References to "an embodiment," "one embodiment," "a particular embodiment," "some embodiments," "various embodiments," and the like do not necessarily refer to the same embodiment. A large number of possible embodiments are contemplated, including specific embodiments described in detail, as well as modifications or alternatives that fall within the spirit or scope of the disclosure. Not all embodiments will necessarily manifest any or all of the potential advantages described herein.

Unless stated otherwise, the specific embodiments are not intended to limit the scope of claims that are drafted based on this disclosure to the disclosed forms, even where only a single example is described with respect to a particular feature. The disclosed embodiments are thus intended to be illustrative rather than restrictive, absent any statements to the contrary. The application is intended to cover such alternatives, modifications, and equivalents that would be apparent to a person skilled in the art having the benefit of this disclosure.

Particular features, structures, or characteristics may be combined in any suitable manner consistent with this disclosure. The disclosure is thus intended to include any feature or combination of features disclosed herein (either explicitly or implicitly), or any generalization thereof. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

For example, while the appended dependent claims are drafted such that each depends on a single other claim, additional dependencies are also contemplated. Where appropriate, it is also contemplated that claims drafted in one statutory type (e.g., apparatus) suggest corresponding claims of another statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to the singular forms such "a," "an," and "the" are intended to mean "one or more" unless the context clearly dictates otherwise. Reference to "an item" in a claim thus does not preclude additional instances of the item.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," covering x but not y, y but not x, and both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one of element of the set [w, x, y, z], thereby covering all possible combinations in this list of options. This phrase is not to be interpreted to require that there is at least one instance of w, at least one instance of x, at least one instance of y, and at least one instance of z.

Various "labels" may proceed nouns in this disclosure. Unless context provides otherwise, different labels used for a feature (e.g., "first circuit," "second circuit," "particular circuit," "given circuit," etc.) refer to different instances of the feature. The labels "first," "second," and "third" when applied to a particular feature do not imply any type of ordering (e.g., spatial, temporal, logical, etc.), unless stated otherwise.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical). More specifically, this formulation is used to indicate that this structure is arranged to perform the one or more tasks during operation. A structure can be said to be "configured to" perform some task even if the structure is not currently being operated. Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function. This unprogrammed FPGA may be "configurable to" perform that function, however.

Reciting in the appended claims that a structure is "configured to" perform one or more tasks is expressly intended not to invoke 35 U.S.C. § 112(f) for that claim element. Should Applicant wish to invoke Section 112(f) during prosecution, it will recite claim elements using the "means for" [performing a function] construct.

The phrase "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

What is claimed is:

1. An apparatus, comprising:
a first divider circuit configured to generate a reference voltage using a voltage level of a power supply node;
a second divider circuit including a first resistor with a first temperature coefficient and a second resistor with a second temperature coefficient, wherein the first resistor is configured to generate a first current using an input voltage and the voltage level of the power supply node, and wherein the second resistor is configured to generate a second current using the input voltage; and
a buffer circuit including a differential amplifier circuit, a capacitor and a plurality of switches, wherein:
the differential amplifier circuit includes a first input node, a second input node, and an output node;
the plurality of switches is driven using a clock signal and configured to couple the capacitor between the output node and the first input node, and
the buffer circuit is configured to:
generate the input voltage using the reference voltage; and
generate an output current using a difference between the first current and the second current.

2. The apparatus of claim 1, wherein the first divider circuit includes a third resistor and a fourth resistor coupled, in series, between the power supply node and a ground supply node, and wherein to generate the reference voltage, the first divider circuit is configured to generate a reference current having a value inversely proportional to a sum of respective values of the third resistor and the fourth resistor.

3. The apparatus of claim 2, wherein a value of the third resistor is the same as a value of the fourth resistor.

4. The apparatus of claim 1, wherein the buffer circuit includes a differential amplifier circuit that includes a first input node, a second input node, and an output node, wherein the output node is coupled to the first input node.

5. The apparatus of claim 1, wherein the first temperature coefficient and the second temperature coefficient have the same sign.

6. The apparatus of claim 5, wherein the first temperature coefficient and second temperature coefficient are different from one another.

7. The apparatus of claim 5, wherein the first resistor and second resistor are formed from materials having different resistivities.

8. The apparatus of claim 5, wherein a ratio, at a particular temperature, of resistance values of the first and second resistors is approximately equal to a ratio, at the particular temperature, of the first and second temperature coefficients.

9. A method, comprising:
generating, by a first divider circuit using a voltage level of a power supply node, a reference voltage on a reference node;
setting, by a buffer circuit, a terminal node of a second divider circuit to a particular voltage level, wherein the second divider circuit includes a first resistor with a first temperature coefficient and a second resistor with a second temperature coefficient;
generating a first current using the first resistor, the voltage level of the power supply node and the particular voltage level;
generating a second current using the second resistor and the particular voltage level;
generating, by the buffer circuit, an output current using a difference between the first current and the second current; and
generating a sawtooth output signal using the output current.

10. The method of claim 9, wherein the first divider circuit includes a third resistor and a fourth resistor coupled, in series, between the power supply node and a ground supply node, and wherein generating the reference voltage includes generating, by the first divider circuit, a reference current having a value inversely proportional to a sum of respective values of the third resistor and the fourth resistor.

11. The method of claim 10, wherein a value of the third resistor is the same as a value of the fourth resistor.

12. The method of claim 9, wherein the first temperature coefficient and the second temperature coefficient have the same sign.

13. The method of claim 9, wherein the buffer circuit includes a differential amplifier circuit that includes a first input node, a second input node, and an output node, wherein the output node is coupled to the first input node, and further comprising:
performing a comparison of respective voltage levels of the first input node and the second input node; and
generating the particular voltage level using a result of the comparison.

14. The method of claim 9, wherein the buffer circuit includes a differential amplifier circuit that includes a first input node, a second input node, and an output node, wherein the first input node is coupled to the terminal node, and the second input node is coupled to the reference node, and wherein generating the sawtooth output signal includes coupling a capacitor between the first input node and the output node using a switched capacitor arrangement driven using a clock signal.

15. An apparatus, comprising:
an oscillator circuit configured to generate a clock signal;
a voltage-source circuit including a first resistor with a first temperature coefficient and a second resistor with a second temperature coefficient, wherein the voltage-source circuit is configured to:
generate an input voltage using a reference voltage;
generate a first current using the input voltage and a voltage level of a power supply node;
generate a second current using the second resistor and the input voltage;

generate an output current using the first current and the second current; and generate a time-varying output voltage using the output current and the clock signal; and a frequency control circuit configured to generate a frequency control signal using the time-varying output voltage, wherein either the voltage-source circuit or the frequency control circuit is further configured to sample, using the clock signal, the time-varying output voltage to generate a sampled signal; and wherein the oscillator circuit is further configured to adjust a frequency of the clock signal using the frequency control signal.

16. The apparatus of claim 15, wherein the frequency control circuit is further configured to generate an error signal using the sampled signal and a threshold signal; and integrate the error signal to generate the frequency control signal.

17. The apparatus of claim 15, wherein the voltage-source circuit is further configured to:

divide a frequency of the clock signal to generate a reduced-frequency clock signal; and generate the time-varying output voltage using the output current and the reduced-frequency clock signal.

18. The apparatus of claim 15, wherein the voltage-source circuit includes:

a differential amplifier circuit that includes a first input node, a second input node, and an output node;

a capacitor; and a plurality of switches driven using the clock signal and configured to couple the capacitor between the output node and the first input node.

19. The apparatus of claim 15, wherein the first temperature coefficient and the second temperature coefficient have the same sign.

20. The apparatus of claim 15, wherein the voltage-source circuit includes a third resistor and a fourth resistor coupled, in series, between the power supply node and a ground supply node, and wherein the voltage-source circuit is further configured to:

generate a reference current whose value is inversely proportional to a sum of respective values of the third resistor and the fourth resistor; and generate the reference voltage using the reference current.

* * * * *